United States Patent
Wu et al.

(10) Patent No.: US 6,197,630 B1
(45) Date of Patent: Mar. 6, 2001

(54) METHOD OF FABRICATING A NARROW BIT LINE STRUCTURE

(75) Inventors: King-Lung Wu, Tainan; Chuan-Fu Wang, Sun-Chung, both of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/386,675

(22) Filed: Aug. 31, 1999

(51) Int. Cl.[7] .................. H01L 21/302; H01L 21/461
(52) U.S. Cl. ................. 438/238; 438/253; 438/396; 438/719; 438/720; 438/721
(58) Field of Search ................. 438/238, 239, 438/262, 256, 712, 713, 719, 720, 721

(56) References Cited

U.S. PATENT DOCUMENTS

| | | | |
|---|---|---|---|
| 5,700,731 | * 12/1997 | Lin et al. | 438/381 |
| 5,858,829 | * 1/1999 | Chen | 438/238 |
| 6,097,051 | * 8/2000 | Torii et al. | 438/306 |
| 6,100,126 | * 8/2000 | Chen et al. | 438/953 |
| 6,121,085 | * 9/2000 | Liang et al. | 438/256 |

* cited by examiner

Primary Examiner—Benjamin L. Utech
Assistant Examiner—Duy-Vu Deo

(57) ABSTRACT

A method of fabricating a narrow bit line structure is disclosed. The fabrication includes the steps as follows. At first, the interpoly dielectric layer is formed over the MOSFET. Then the landing pad is formed in the interpoly dielectric layer. Afterwards, the first polysilicon layer, the tungsten silicide layer, the silicon-oxy-nitride layer, and the second polysilicon layer is continuously formed over the interpoly dielectric layer. The defined photoresist layer is formed on the second polysilicon layer. A portion of the second polysilicon layer is etched, using the defined photoresist layer as a mask. Afterwards, the defined photoresist layer is removed. The polysilicon spacer is formed in the second polysilicon layer sidewall. The silicon oxide layer is deposited over the second polysilicon layer. Next, the silicon oxide layer is etched back to expose the second polysilicon layer. The second polysilicon layer, the polysilicon spacer, a portion of the silicon-oxy-nitride layer, a portion of the tungsten silicide layer, and a portion of the first polysilicon layer is Sequentially etched to expose the interpoly dielectric layer, using the silicon oxide layer as a hard mask. Afterwards, the silicon oxide layer is removed on the silicon-oxy-nitride layer. Finally, the narrow bit line structure is formed over the landing pad.

40 Claims, 4 Drawing Sheets

METHOD OF FABRICATING A NARROW BIT LINE STRUCTURE

BACKGROUND OF THE INVENTION

1. Field of the Invention

The present invention relates to a method of fabricating a bit line structure, and particularly to a method of fabricating a narrow bit line structure.

2. Description of the Prior Art

Recently, ultra large scale integration (ULSI) semiconductor technologies have dramatically increased the integrated circuit density on the chips formed on the semiconductor substrate. This increase in circuit density has resulted from downsizing of the individual devices and the resulting increase in device packing density. The reduction in device size was achieved predominantly by recent advances in high resolution photolithography, directional (anisotropic) plasma etching, and other semiconductor technology innovations. However, future requirements for even greater circuit density is putting additional demand on the semiconductor processing technologies and on device electrical requirements.

The rapidly increasing integrated circuit in the number of cells on the DRAM chip, it is becoming increasingly difficult to fabricate a narrow bit line structure. FIGS. 1A and 1B shows the cross-sectional view of a traditional bit line structure 160. At first, the polysilicon layer 120 is formed on the interpoly dielectric layer 110 and the landing pad 100. Afterwards, the tungsten silicide layer 130 is formed on the polysilicon layer 120. Next, the silicon-oxy-nitride layer 140 is formed on the tungsten silicide layer 130. Finally, the defined photoresist layer 150 is formed, having a width about 0.2 $\mu$m, as shown in FIG. 1A. However, a portion of silicon-oxy-nitride layer 140, a portion of the tungsten silicide layer 130, and a portion of the polysilicon layer 120 are etched to expose the land pad 100 and the interpoly dielectric layer 110, using the defined photoresist layer 150 as a mask. Then, the defined photoresist layer 150 is removed on silicon-oxy-nitride layer 140. Finally, the bit line structure 160 is formed on the landing pad 100, as shown in FIG. 1B. Due to this bit line structure 160 will not obtain the linewidth of 0.1 $\mu$m. Thus, this present invention is disclosed by applying novel processes, and improving the disadvantage.

SUMMARY OF THE INVENTION

In accordance with the present invention, a method is provided for forming a narrow bit line structure that substantially reduces linewidth. In one embodiment, the fabrication process includes the steps as follows. At first, the interpoly dielectric layer is formed over the metal-oxide-semiconductor field effect transistor. Then the landing pad is formed in the interpoly dielectric layer. Afterwards, the first polysilicon layer is formed on the interpoly dielectric layer and the landing pad. The tungsten silicide layer is formed on the first polysilicon layer. Next, the silicon-oxy-nitride layer is formed on the tungsten silicide layer. Then the second polysilicon layer is formed on the silicon-oxy-nitride layer. The defined photoresist layer is formed on the second polysilicon layer. A portion of the second polysilicon layer is etched, using the defined photoresist layer as a mask. Afterwards, the defined photoresist layer is removed. The polysilicon spacer is formed in the second polysilicon layer sidewall and on the silicon-oxy-nitride layer. The silicon oxide layer is deposited on the second polysilicon layer, the polysilicon spacer, and the silicon-oxy-nitride layer. Next, the silicon oxide layer is etched back to expose the second polysilicon layer. The second polysilicon layer, the polysilicon spacer, a portion of the silicon-oxy-nitride layer, a portion of the tungsten silicide layer, and a portion of the first polysilicon layer is continuously etched to expose the interpoly dielectric layer, using the silicon oxide layer as a hard mask. Afterwards, the silicon oxide layer is removed on the silicon-oxy-nitride layer. Finally, the narrow bit line structure is formed over the landing pad.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

A method of fabricating a narrow bit line structure will now be described in detail. Referring to FIGS. 2A through 2G shows the cross-sectional views illustrative of various stages in the narrow bit line structure in accordance with one embodiment of the present invention.

Figure 1A:
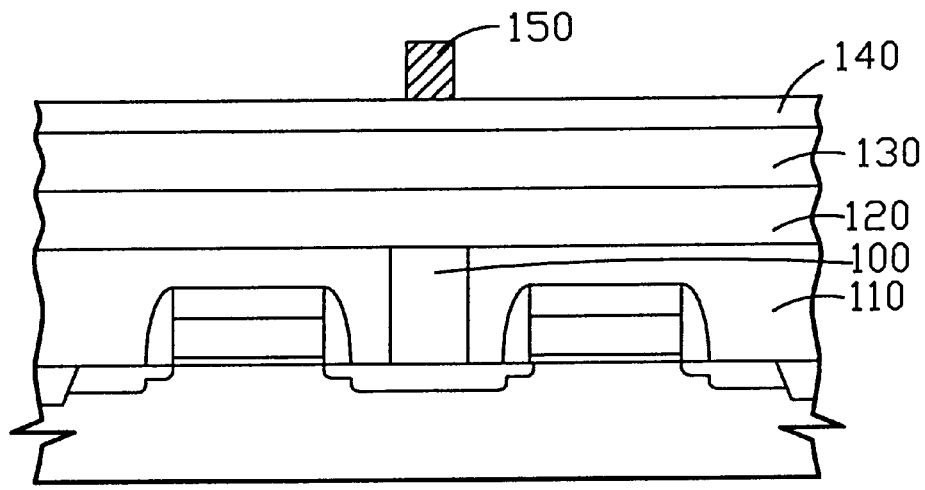
FIGS. 1A and 1B shows the cross-sectional view of a traditional bit line structure.
Figure 1B:
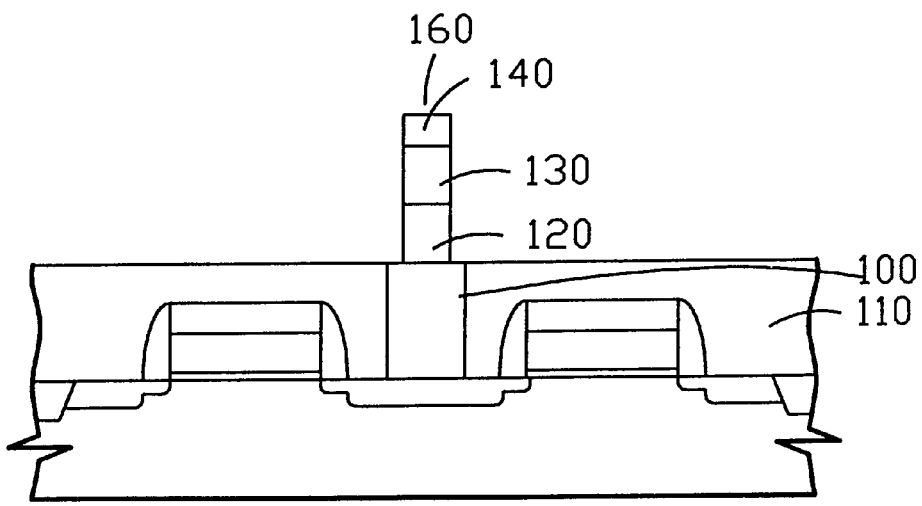
Figure 2A:
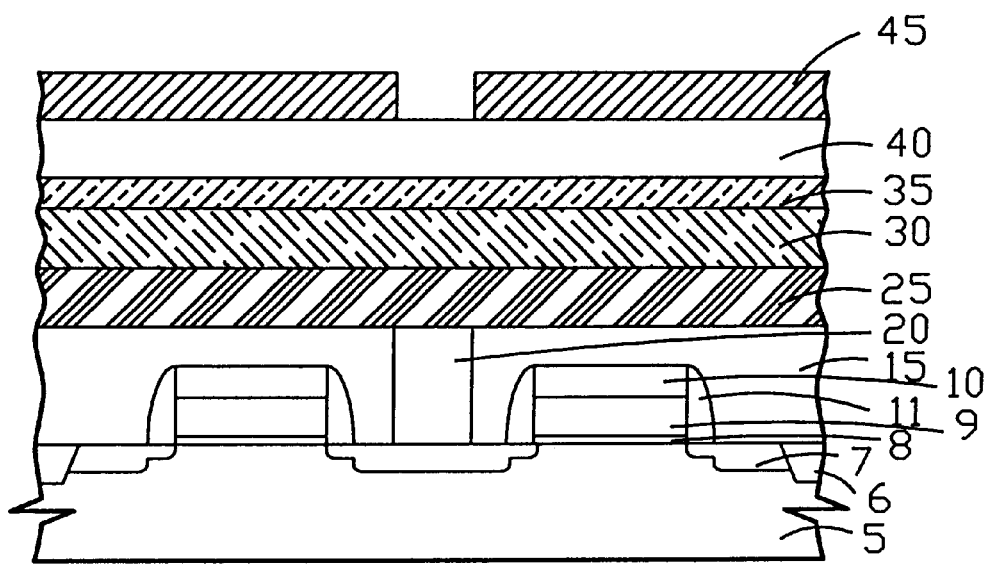
FIGS. 2A through 2G shows the cross-sectional views illustrative of various stages in the narrow bit line structure in accordance with one embodiment of the present invention.

Referring to FIG. 2A, the interpoly dielectric layer 15 is formed, comprising a silicon oxide, using low pressure chemical vapor deposition (LPCVD) procedures and tetra-ethylorthosilicate (TEOS) as a source gas, at a temperature between about 500.degree. to 800.degree. C., to a thickness between about 1000 to 3000 angstroms, over the metal-oxide-semiconductor field effect transistor (MOSFET). The metal-oxide-semiconductor field effect transistor is formed in and on the semiconductor substrate 5, comprising a shallow trench isolation (STI) 6, a source/drain 7, a polycide word line 9, an oxide spacer 11, a thin oxide 8, and a cap oxide layer 10. Then the landing pad 20 is formed, comprising polysilicon plug in the interpoly dielectric layer 15. Afterwards, the first polysilicon layer 25 is formed, comprising LPCVD procedures and silane ($SiH_4$) as a source gas, at a temperature between about 600.degree. to 650.degree. C., to a thickness between about 1000 to 3000 angstroms, on the interpoly dielectric layer 15 and the landing pad 20. The tungsten silicide layer 30 is formed, comprising LPCVD procedures, at a temperature between about 500.degree. to 600.degree. C., to a thickness between about 1000 to 3000 angstroms, using tungsten hexafluoride and silane as source gasses, on the first polysilicon layer 25. Next, the silicon-oxy-nitride layer 35 is formed, comprising plasma enhanced chemical vapor deposition (PECVD) procedures, at a temperature about 450.degree. C., to a thickness between about 100 to 500 angstroms, using silane, nitrous oxide, and nitrogen as source gasses, on the tungsten silicide layer 30. Then the second polysilicon layer 40 is formed, comprising LPCVD procedures and silane ($SiH_4$) as a source gas, at a temperature between about 600.degree. to 650.degree. C., to a thickness between about 1000 to 1500 angstroms, on the silicon-oxy-nitride layer 35. The defined photoresist layer 45 is formed on the second polysilicon layer 40.

Figure 2B:
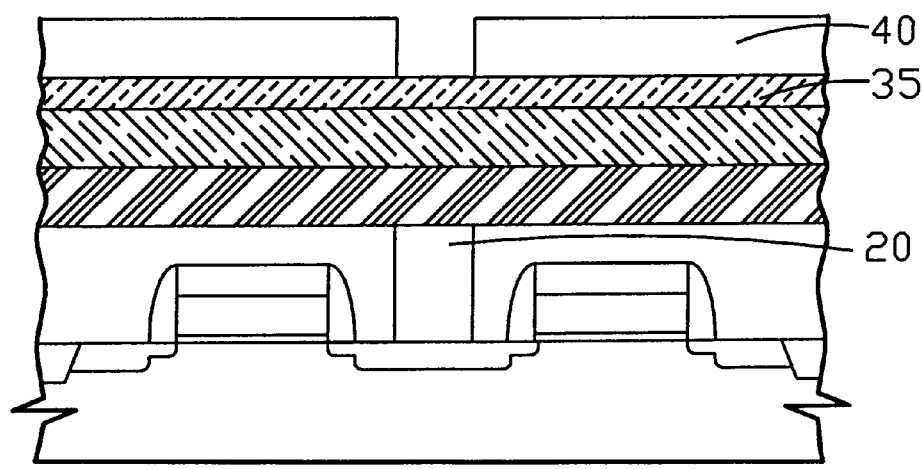
Figure 2C:
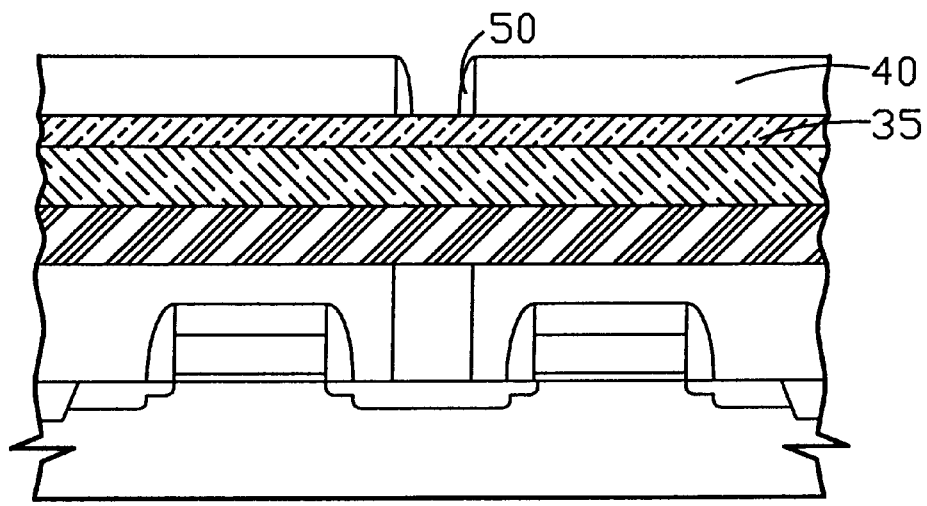

Referring to FIGS. 2B and 2C, a portion of the second polysilicon layer 40 is etched, comprising reactive ion etching (RIE) procedures with $Cl_2$ as an etchant, using the defined photoresist layer 45 as a mask. Afterwards, the defined photoresist layer 45 is removed, as shown in FIG. 2B. The polysilicon spacer 50 is formed, having a thickness about 500 angstroms, in the second polysilicon layer 40 sidewall and on the silicon-oxy-nitride layer 35, as shown in FIG. 2C.

Figure 2D:
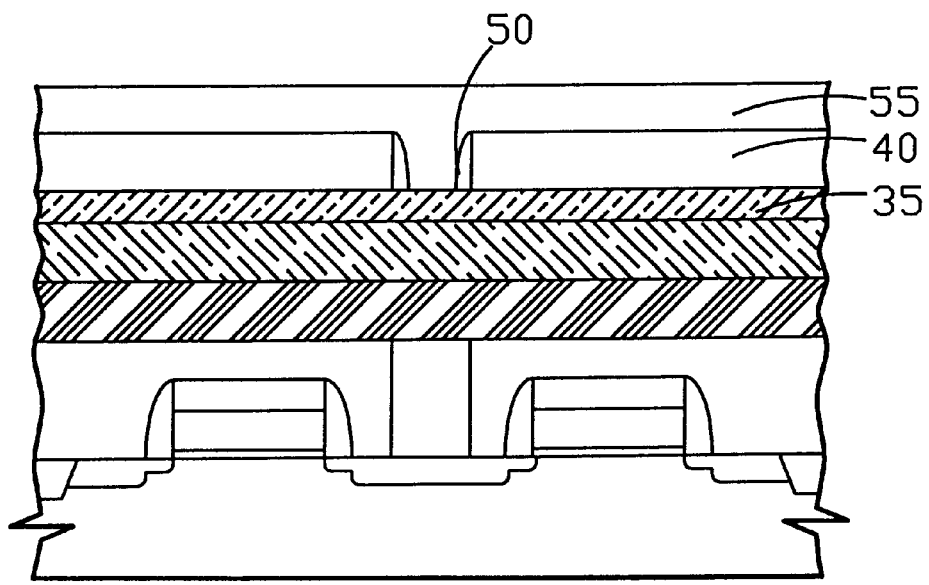
Figure 2E:
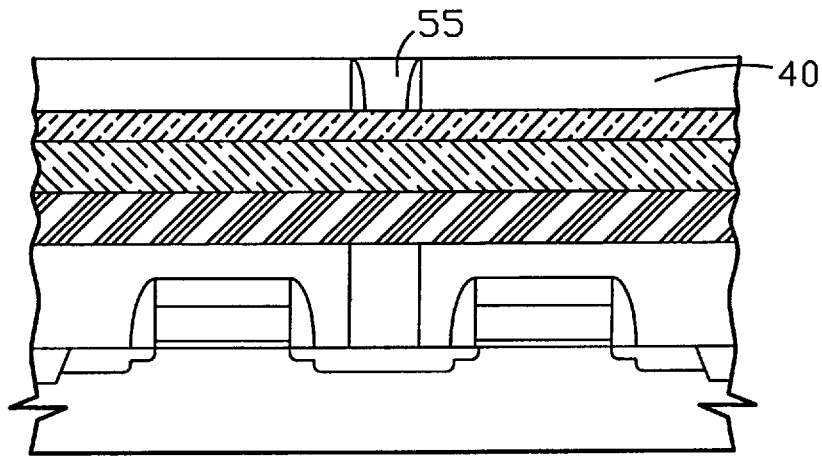

Referring to FIGS. 2D and 2E, the silicon oxide layer 55 is deposited, comprising LPCVD procedures and TEOS as a source gas, at a temperature between about 500.degree. to 800.degree. C., to a thickness about 3000 angstroms, on the second polysilicon layer 40, the polysilicon spacer 50, and the silicon-oxy-nitride layer 35, as shown in FIG. 2D. Next, the silicon oxide layer 55 is etched back, comprising reactive ion etching (RIE) procedures with $CF_4$ as an etchant or chemical mechanical polishing (CMP), to expose the second polysilicon layer 40, as shown in FIG. 2E.

Figure 2F:
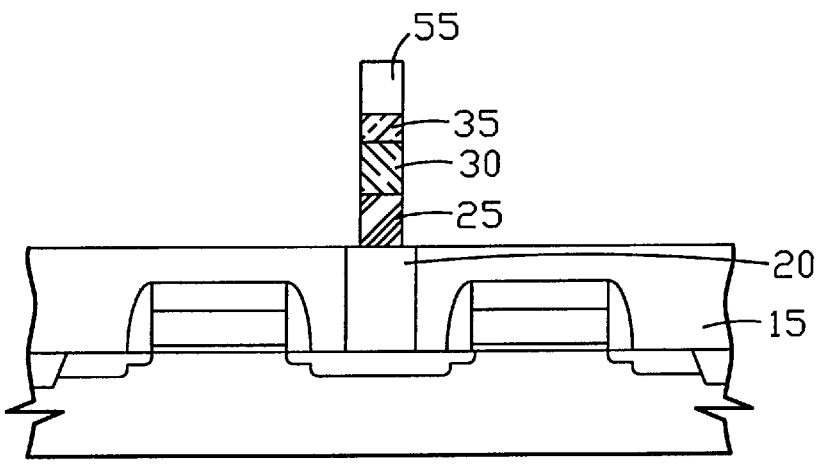
Figure 2G:
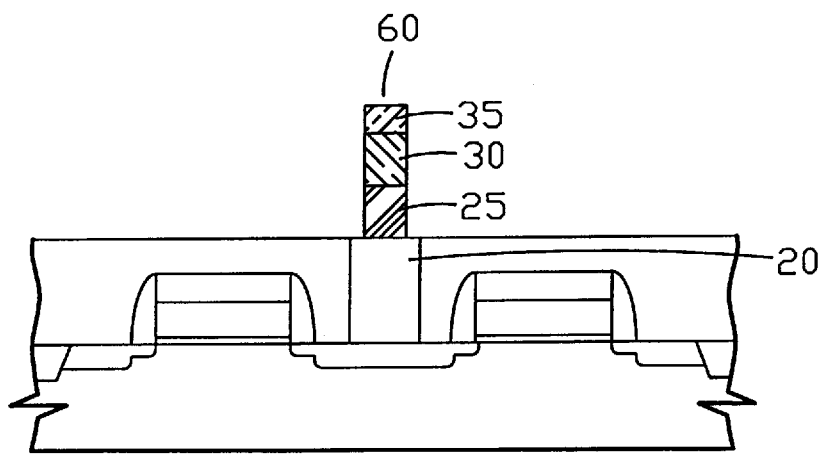

Referring to FIGS. 2F and 2G, the following etching processes will use the silicon oxide layer 55 as a hard mask. The second polysilicon layer 40 and the polysilicon spacer 50 are etched, using reactive ion etching (RIE) procedures with $Cl_2$ as an etchant. Then a portion of the silicon-oxy-nitride layer 35 is etched, using reactive ion etching (RIE) procedures with $CHF_3$ as an etchant. Afterwards, a portion of the tungsten silicide layer 30 is etched, using reactive ion etching (RIE) procedures with $Cl_2$, HBr, and Ar as an etchant. Next, a portion of the first polysilicon layer 25 is etched, using reactive ion etching (RIE) procedures with $Cl_2$ as an etchant to expose the interpoly dielectric layer 15, as shown in FIG. 2F. The silicon oxide layer 55 is removed, using wet etching procedures with dilute hydrofluoric acid (DHF) as an etchant, on the silicon-oxy-nitride layer 35. Finally, the narrow bit line structure 60 is formed, having a critical dimension, over the landing pad 20. The critical dimension is about 0.1 $\mu$m, as shown in FIG. 2G.

Although specific embodiments have been illustrated and described, it will be obvious to those skilled in the art that various modifications may be made without departing from the spirit which is intended to be limited solely by the appended claims.

What is claimed is:

1. A method of fabricating a narrow bit line structure on a semiconductor substrate, said method comprising:

forming a interpoly dielectric layer over a metal-oxide-semiconductor field effect transistor (MOSFET);

forming a landing pad in said interpoly dielectric layer;

forming a first polysilicon layer on said interpoly dielectric layer and said landing pad;

forming a metal silicide layer on said first polysilicon layer;

forming a insulating layer on said metal silicide layer;

forming a second polysilicon layer on said insulating layer;

forming a defined photoresist layer on said second polysilicon layer;

etching a portion of said second polysilicon layer using said defined photoresist layer as a mask;

removing said defined photoresist layer;

forming a polysilicon spacer in said second polysilicon layer sidewall and on said insulating layer;

depositing a dielectric layer on said second polysilicon layer, said polysilicon spacer, and said insulating layer;

etching back said dielectric layer to expose said second polysilicon layer;

etching said second polysilicon layer, said polysilicon spacer, a portion of said insulating layer, a portion of said metal silicide layer, and a portion of said first polysilicon layer to expose said interpoly dielectric layer, using said dielectric layer as a hard mask;

removing said dielectric layer on said insulating layer; and forming said narrow bit line structure over said landing pad, said narrow bit line structure having a critical dimension.

2. The method according to claim 1, wherein said interpoly dielectric layer comprises a silicon oxide, using low pressure chemical vapor deposition (LPCVD) procedures and tetraethylorthosilicate (TEOS) as a source gas, at a temperature between about 500.degree. to 800.degree. C., to a thickness between about 1000 to 3000 angstroms.

3. The method according to claim 1, wherein said metal-oxide-semiconductor field effect transistor (MOSFET) is formed in and on said semiconductor substrate, comprising a shallow trench isolation (STI), a source/drain, a polycide word line, an oxide spacer, a thin oxide, and a cap oxide layer.

4. The method according to claim 1, wherein said landing pad comprises a polysilicon plug.

5. The method according to claim 1, wherein said first polysilicon layer is formed, comprising LPCVD procedures and silane ($SiH_4$) as a source gas, at a temperature between about 600.degree. to 650.degree. C., to a thickness between about 1000 to 3000 angstroms.

6. The method according to claim 1, wherein said metal silicide layer is formed, comprising LPCVD procedures, at a temperature between about 500.degree. to 600.degree. C., to a thickness between about 1000 to 3000 angstroms, using tungsten hexafluoride and silane as source gasses.

7. The method according to claim 1, wherein said insulating layer is formed, comprising plasma enhanced chemical vapor deposition (PECVD) procedures, at a temperature about 450.degree. C., to a thickness between about 100 to 500 angstroms, using silane, nitrous oxide, and nitrogen as source gasses.

8. The method according to claim 1, wherein said second polysilicon layer is formed, comprising LPCVD procedures and silane ($SiH_4$) as a source gas, at a temperature between about 600.degree. to 650.degree. C., to a thickness between about 1000 to 1500 angstroms.

9. The method according to claim 1, wherein said second polysilicon layer is etched, comprising reactive ion etching (RIE) procedures with $Cl_2$ as an etchant.

10. The method according to claim 1, wherein said polysilicon spacer is formed, having a thickness about 500 angstroms.

11. The method according to claim 1, wherein said dielectric layer is deposited, comprising LPCVD procedures and TEOS as a source gas, at a temperature between about 500.degree. to 800.degree. C., to a thickness about 3000 angstroms.

12. The method according to claim 1, wherein said dielectric layer is etched back, comprising reactive ion etching (RIE) procedures with $CF_4$ as an etchant.

13. The method according to claim 1, wherein said dielectric layer is etched back, comprising chemical mechanical polishing (CMP).

14. The method according to claim 1, wherein said second polysilicon layer is etched, comprising reactive ion etching (RIE) procedures with $Cl_2$ as an etchant.

15. The method according to claim 1, wherein said polysilicon spacer is etched, comprising reactive ion etching (RIE) procedures with $Cl_2$ as an etchant.

16. The method according to claim 1, wherein said insulating layer is etched, comprising reactive ion etching (RIE) procedures with $CHF_3$ as an etchant.

17. The method according to claim 1, wherein said metal silicide layer is etched, comprising reactive ion etching (RIE) procedures with $Cl_2$, HBr, and Ar as an etchant.

18. The method according to claim 1, wherein said first polysilicon layer is etched, comprising reactive ion etching (RIE) procedures with $Cl_2$ as an etchant.

19. The method according to claim 1, wherein said dielectric layer is removed, comprising wet etching procedures with dilute hydrofluoric acid (DHF) as an etchant.

20. The method according to claim 1, wherein said critical dimension is about 0.1 μm.

21. A method of fabricating a narrow bit line structure on a semiconductor substrate, said method comprising:

forming a interpoly dielectric layer over a metal-oxide-semiconductor field effect transistor (MOSFET);

forming a landing pad in said interpoly dielectric layer;

forming a first polysilicon layer on said interpoly dielectric layer and said landing pad;

forming a tungsten silicide layer on said first polysilicon layer;

forming a silicon-oxy-nitride layer on said tungsten silicide layer;

forming a second polysilicon layer on said silicon-oxy-nitride layer;

forming a defined photoresist layer on said second polysilicon layer;

etching a portion of said second polysilicon layer using said defined photoresist layer as a mask;

removing said defined photoresist layer;

forming a polysilicon spacer in said second polysilicon layer sidewall and on said silicon-oxy-nitride layer;

depositing a silicon oxide layer on said second polysilicon layer, said polysilicon spacer, and said silicon-oxy-nitride layer;

etching back said silicon oxide layer to expose said second polysilicon layer;

etching said second polysilicon layer, said polysilicon spacer, a portion of said silicon-oxy-nitride layer, a portion of said tungsten silicide layer, and a portion of said first polysilicon layer to expose said interpoly dielectric layer, using said silicon oxide layer as a hard mask;

removing said silicon oxide layer on said silicon-oxy-nitride layer; and forming said narrow bit line structure over said landing pad, said narrow bit line structure having a critical dimension.

22. The method according to claim 21, wherein said interpoly dielectric layer comprises a silicon oxide, using low pressure chemical vapor deposition (LPCVD) procedures and tetraethylorthosilicate (TEOS) as a source gas, at a temperature between about 500.degree. to 800.degree. C., to a thickness between about 1000 to 3000 angstroms.

23. The method according to claim 21, wherein said metal-oxide-semiconductor field effect transistor (MOSFET) is formed in and on said semiconductor substrate, comprising a shallow trench isolation (STI), a source/drain, a polycide word line, an oxide spacer, a thin oxide, and a cap oxide layer.

24. The method according to claim 21, wherein said landing pad comprises a polysilicon plug.

25. The method according to claim 21, wherein said first polysilicon layer is formed, comprising LPCVD procedures and silane ($SiH_4$) as a source gas, at a temperature between about 600.degree. to 650.degree. C., to a thickness between about 1000 to 3000 angstroms.

26. The method according to claim 21, wherein said tungsten silicide layer is formed, comprising LPCVD procedures, at a temperature between about 500.degree. to 600.degree. C., to a thickness between about 1000 to 3000 angstroms, using tungsten hexafluoride and silane as source gasses.

27. The method according to claim 21, wherein said silicon-oxy-nitride layer is formed, comprising plasma enhanced chemical vapor deposition (PECVD) procedures, at a temperature about 450.degree. C., to a thickness between about 100 to 500 angstroms, using silane, nitrous oxide, and nitrogen as source gasses.

28. The method according to claim 21, wherein said second polysilicon layer is formed, comprising LPCVD procedures and silane ($SiH_4$) as a source gas, at a temperature between about 600.degree. to 650.degree. C., to a thickness between about 1000 to 1500 angstroms.

29. The method according to claim 21, wherein said second polysilicon layer is etched, comprising reactive ion etching (RIE) procedures with $Cl_2$ as an etchant.

30. The method according to claim 21, wherein said polysilicon spacer is formed, having a thickness about 500 angstroms.

31. The method according to claim 21, wherein said silicon oxide layer is deposited, comprising LPCVD procedures and TEOS as a source gas, at a temperature between about 500.degree. to 800.degree. C., to a thickness about 3000 angstroms.

32. The method according to claim 21, wherein said silicon oxide layer is etched back, comprising reactive ion etching (RIE) procedures with $CF_4$ as an etchant.

33. The method according to claim 21, wherein said silicon oxide layer is etched back, comprising chemical mechanical polishing (CMP).

34. The method according to claim 21, wherein said second polysilicon layer is etched, comprising reactive ion etching (RIE) procedures with $Cl_2$ as an etchant.

35. The method according to claim 21, wherein said polysilicon spacer is etched, comprising reactive ion etching (RIE) procedures with $Cl_2$ as an etchant.

36. The method according to claim 21, wherein said silicon-oxy-nitride layer is etched, comprising reactive ion etching (RIE) procedures with $CHF_3$ as an etchant.

37. The method according to claim 21, wherein said tungsten silicide layer is etched, comprising reactive ion etching (RIE) procedures with $Cl_2$, HBr, and Ar as an etchant.

38. The method according to claim 21, wherein said first polysilicon layer is etched, comprising reactive ion etching (RIE) procedures with $Cl_2$ as an etchant.

39. The method according to claim 21, wherein said silicon oxide layer is removed, comprising wet etching procedures with dilute hydrofluoric acid (DHF) as an etchant.

40. The method according to claim 21, wherein said critical dimension is about 0.1 μm.

\* \* \* \* \*